April 21, 1964 G. C. SPACEK 3,130,322

DOUBLE PUMPED PARAMETRIC AMPLIFIER

Filed June 13, 1962

INVENTOR.
George Chirad Spacek
BY
Paul J. Ethington
ATTORNEY 3,130,322

DOUBLE PUMPED PARAMETRIC AMPLIFIER

George Ctirad Spacek, Santa Barbara, Calif., assignor to General Motors Corporation, Detroit, Mich., a corporation of Delaware Filed June 13, 1962, Ser. No. 202,163
4 Claims. (Cl. 307—88)

This invention relates to parametric amplifiers and more particularly to the use of a plurality of energy sources operating at respective frequencies for improving the gain and/or bandwidth performance of the amplifier.

A parametric amplifier is a low noise signal amplifier which is used to amplify extremely weak signals. In general, a parametric amplifier employs one or more resonant circuits suitably coupled to an energy storage element whose value is made to vary according to the frequency of an energy source. Energy from the source may be transferred to the field of a resonant tank, such energy transfer being used to amplify an input signal. The term parametric is used inasmuch as the energy source alters the value of a parameter of the energy storage element.

The term parametric thus implies an operation in which a parameter of an electronic circuit is varied to produce amplification of an input signal. This parameter is associated with an energy storage device which may be either a capacitor or inductor. The energy source, usually called a pump, is coupled with the energy storage element such that a parameter thereof is effectively varied in a predetermined frequency relation with variations in the stored energy due to the input signal. Work must be done in varying the parameter in the direction which increases the stored energy. In the case of a capacitive storage element, energy goes into the electric field existing across the plates and thus the voltage is amplified. There is no work done in changing the capacitance back to the original value since this effectively occurs when the input voltage goes through zero. The result is amplification of the input signal voltage across the capacitor with a net flow of energy from the energy source.

For purposes of discussion, it is helpful to assume that the capacitor plates are quickly drawn apart at both positive and negative maximums of the input voltage and pushed together as the input voltage goes through zero. However, it is to be understood that both the input voltage and the voltage from the energy source vary sinusoidally. Thus, the capacitor plates are smoothly drawn apart and pushed together in a sinusoidally varying manner. The result is a retention of the original signal wave form without abrupt discontinuities at the positive and negative peaks.

In a single resonant tank arrangement, commonly called degenerate amplification, a particular phase relationship must exist between the energy supply source and the input signal to the resonant tank circuit. For a two tank arrangement, commonly called non-degenerate or quasi-degenerate, this phase restriction does not appear. However, a fundamental frequency relation does exist. In general, the frequency of the energy source or pump must approximately equal the sum of the resonant frequencies of the resonant tank circuits. Corresponding to this relation, if a voltage is impressed across one of the tanks at its resonant frequency, the mixing action in the variable capacitor causes a signal component to emerge which has a frequency equal to the resonant frequency of the second tank circuit. Thus, a second voltage is developed across the second tank at its resonant frequency. It can be seen that the magnitude of this voltage is dependent upon both the magnitude and frequency of the signal impressed on the first tank and the available pump power. The gain of a conventional two tank parametric amplifier is dependent upon the magnitude and frequency of the voltage generated across the second tank circuit. This fundamental rule can be proven with basic circuit analysis.

The resonant tank circuits may be thought of as parallel resonant circuits having a maximum impedance at the resonant frequency. As previously mentioned the frequency of the signal across the second tank is equal to the difference between the pump frequency and the signal frequency. If the frequency of the difference voltage generated by the capacitor mixing action is equal to the resonant frequency of the second tank, the voltage across the second tank will be a maximum and no reactive component of admittance is present. Thus, it can be seen that the gain of the amplifier is dependent upon the frequency of the signal impressed upon the first tank circuit. This is appropriately termed the input signal. For purposes of discussion, the first tank may be thus referred to as the signal tank and the second tank referred to as the idler tank. The signal developed across the second tank is therefore the idler signal.

If, on the other hand, the input signal frequency varies from the resonant frequency of the first tank such that the frequency of the difference signal is not equal to the resonant frequency of the second tank, then the gain will decrease with the frequency deviation. This is primarily due to the fact that an effective susceptance is coupled into the first tank which prevents voltage amplification at the signal frequency. As can be seen from the previous discussion, this signal tank susceptance is a result of the reactive components of the second tank voltage. A further reason for the decrease in gain is that the impedance of the first tank to the signal frequency is lower when not at resonance and thus, the input signal is weaker.

It can be seen that to make the second tank wideband will increase bandwith by lowering the maximum obtainable gain. A widely recognized characteristic of parametric amplifiers, especially of resonant tank or cavity type amplifiers, is a constant gain bandwidth product. In other words, the frequency bandwidth over which high gain is obtainable becomes narrower with increased gain.

It is the primary object of this invention to improve the gain bandwidth product of parametric amplifiers. It is similarly an object of the invention to provide a parametric amplifier capable of producing high gain at a plurality of input signal frequencies. The improvement to the bandwidth over which high gain is possible is made by means of the present invention without sacrificing the ultimate gain of which the amplifier is capable.

In general, the objects are accomplished by providing a plurality of pump voltage sources operating at different frequencies such that one pump produces with one signal frequency an idler frequency which is exactly equal to the resonant frequency of the idler tank. Another pump produces with some other signal frequency a second idler frequency which is numerically equal to the first idler frequency and is, therefore, also equal to the resonant frequency of the idler tank. Therefore, at a plurality of signal frequencies, the admittance of the second or idler tank will be pure real and high gain is obtainable from the amplifier.

While this application discusses the invention with reference to particular illustrations in terms of resonant tank parametric amplifiers, it will be apparent to those skilled in the art that the multiple energy source concept is equally applicable to other types of parametric amplifiers, including both positive and negative resistance devices.

These and other objects of the present invention will be more readily understood upon reading of the following specifications taken with the accompanying drawings of which:

Figure 1:
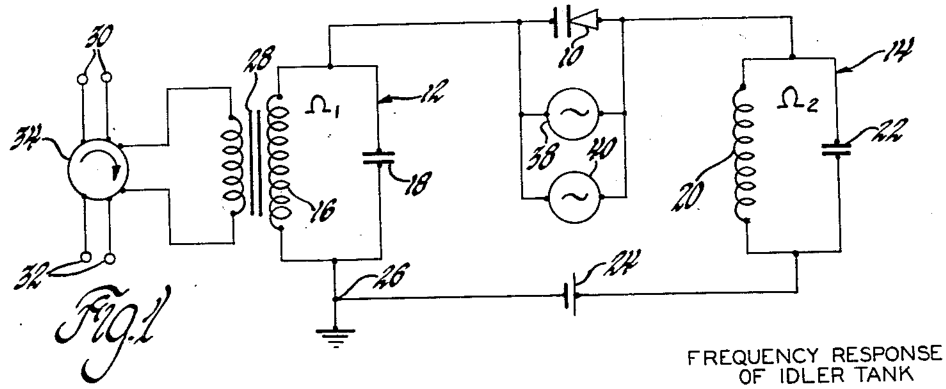
FIGURE 1 is a schematic diagram representative of a negative resistance parametric amplifier of the non-degenerate type.

The negative resistance parametric amplifier shown in FIGURE 1 is a two tank amplifier operated in a non-degenerate mode. The circuit includes an energy storage element in the form of a voltage variable diode capacitor 10, which may for example, be a Varactor. The capacitor 10 is coupled in series with a first resonant tank circuit 12 and a second resonant tank circuit 14. The resonant tank circuit 12 comprises the parallel combination of an inductor 16 and a capacitor 18 and has a resonant frequency $\Omega_1$ at which the parallel circuit impedance is purely real. The resonant tank circuit 14 similarly comprises an inductor 20 connected in parallel with a capacitor 22 and has a resonant frequency $\Omega_2$ at which impedance is purely real. It is to be understood that while the tank circuits 12 and 14 are shown as lumped circuit elements, at microwave frequencies, they may be taken to represent resonant cavities. Similarly, the conductive connections may be taken to represent the proper wave guide configurations. A D.C. bias is provided for the voltage variable capacitor 10 by means of a battery 24, which is connected between one end of the resonant circuit 14 and a point 26 of fixed potential. One end of the resonant circuit 12 is also connected to the point 26 of fixed potential. The resonant circuit 12 serves as the signal tank for the parametric amplifier circuit while the resonant tank circuit 14 is commonly known as the idler tank. The input signal is coupled into the input resonant circuit 12 by means of an inductive signal coupling 28. In the case of a non-degenerate parametric amplifier such as that shown in FIGURE 1, the output signal is also taken from the circuit by means of the inductive coupling 28. The input signal may be applied to a pair of input terminals 30, and the output signals may be taken from a pair of output terminals 32. A circulator 34 is suitably coupled between the input terminals 30, the output terminals 32, and the inductive coupling 28 to provide the necessary switching between the input and output. Such a use for a circulator is well known in the art and will not be described in detail.

Connected across the diode capacitor 10 are two high frequency voltage sources which will hereinafter be referred to as pumps 38 and 40. A suitable high frequency generator such as a klystron may be employed as a pump. It is to be understood that the particular use of two pumps is only illustrative and the number may be increased as suits the operator. Each of the pumps 38 and 40 operates at a different frequency which is of such a value as to be equal to the sum of the resonant frequency $\Omega_2$ of the resonant circuit 14 and the frequency of an input signal applied to terminals 30. The value of the variable capacitor 10 is controlled by the frequencies of the pumps 38 and 40.

An explanation of the value of a capacitor according to the frequency of a reverse bias signal applied thereto was previously made in terms of quickly drawing apart the capacitor plates at the peak of the input signal voltage. This causes a sudden decrease in capacitance and thus, an increase in the voltage across the plates. In this manner the input signal is amplified. In the case of a semi-conductor diode such as the element 10 in FIGURE 1, it has been found that a voltage impressed across the diode element may act, according to the polarity of the voltage, to increase or decrease the width of the depletion layer at the junction in the semi-conductor element. The increasing or decreasing width of this depletion layer has the effect of varying the capacitance of the diode element and, thus, it may be used as a parametric amplifier in the same method as the capacitance element whose plates are drawn apart. Again, the capacitance increases and decreases occur sinusoidally rather than abruptly.

Referring now to the operation of the circuit shown in FIGURE 1, it can be shown that the simultaneous application of a first signal having a frequency $\omega_1$ to the input terminals 30 and a pump signal having a frequency $\omega_3$ to a diode element, such as 10 results in the emergence of a third frequency component which is called the idler frequency. This idler signal has a frequency equal to the difference between the signal frequency $\omega_1$ and the pump frequency $\omega_3$.

Assume for the moment that the circuit shown in FIGURE 1 employs only a single pump source such as 38. In this case there will be but one signal frequency at which the idler frequency, being the difference between the frequency of the pump 38 and the signal frequency, will equal the resonant frequency $\Omega_2$ of the idler circuit 14. Therefore, there will only be one input signal frequency at which the impedance of the idler circuits 14 is pure real and the voltage across the resonant circuit 14 is a maximum. If the signal applied across the input or signal tank circuit 12 varies such that the mixing action of the capacitor 10 results in an idler frequency which does not correspond to the resonant frequency $\Omega_2$ of the idler tank circuit 14, a reactive component of admittance will be introduced across the idler tank circuit 14. This reactive component of the idler tank admittance will be multiplied in the course of the amplification in proportion to the ratio of pump power to signal power. Thus, the effective component of reactive admittance as coupled to the signal tank circuit 12 is much higher than the reactive component which would be experienced if the pump 38 were not on. The large effective idler reactance will make it impossible to produce any gain at the signal frequency. This is to say that the bandwidth over which maximum gain is obtainable is quite narrow. As the ratio of pump to signal power, and accordingly, the gain of the amplifier, increases, the reactive component becomes more detrimental to gain. Thus, the bandwidth becomes narrower with increasing gain.

It should be noted that the resonant frequency $\Omega_1$ of the signal tank circuit 12 and the resonant frequency $\Omega_2$ of the idler tank circuit 14 are, in the case of the non-degenerate amplifier, equal to the average of the frequencies of the two pumps 38 and 40. This condition is not critical to the invention but produces a more symmetrical gain bandwidth characteristic. The frequency of the input signal applied to terminal 30 will generally correspond quite closely to the resonant frequency $\Omega_1$ of the signal circuit 12. In the case of a single pump parametric amplifier, the resonant frequencies $\Omega_1$ and $\Omega_2$ are set such that maximum gain is available when the input signal frequency corresponds with $\Omega_1$. Should the frequency of the input signal vary from the resonant frequency $\Omega_1$, the deviation will result in a large effective reactive component of the idler tank circuit 14 admittance. The effective reactive component of the idler tank admittance, being effectively coupled into the signal tank circuit 12, causes the frequency band over which high gain is obtainable to be quite narrow. Thus, a constant gain bandwidth product is apparent.

Through the addition of a second pump 40 having a frequency $\omega_4$ which is different from that of the first pump 38, the input signal band over which high gain is obtainable can be widened substantially. As will become apparent in the following, the number of pumps is not limited to two, but can be extended to further widen the signal bandwidth. Through the use of two or more independent pumps operating at slightly different frequencies, such as $\omega_3$ and $\omega_4$, one pump produces with some signal frequency $\omega_1$ an idler frequency which is exactly equal to the resonant frequency $\Omega_2$ of the idler tank circuit 14. The other pump whose frequency is $\omega_4$ produces with some other signal frequency $\omega_2$ a second idler frequency which is numerically equal to the first idler frequency and is, therefore, also equal to the resonant frequency $\Omega_2$ of the idler tank circuit 14. In this manner there are two signal frequencies at which the admittance of the idler tank is pure real and high gain is obtainable. It should be noted that although two independent signal frequencies are discussed for $\omega_1$ and $\omega_2$, reference is being made to a single signal source of variable frequency. Where the frequencies of the pumps 38 and 40 are separated by only a small frequency band, the two or more resonance curves of the amplifier system will overlap. The overall effect is then an increase of the bandwidth over which high gain is obtainable.

Figures 2, 3:
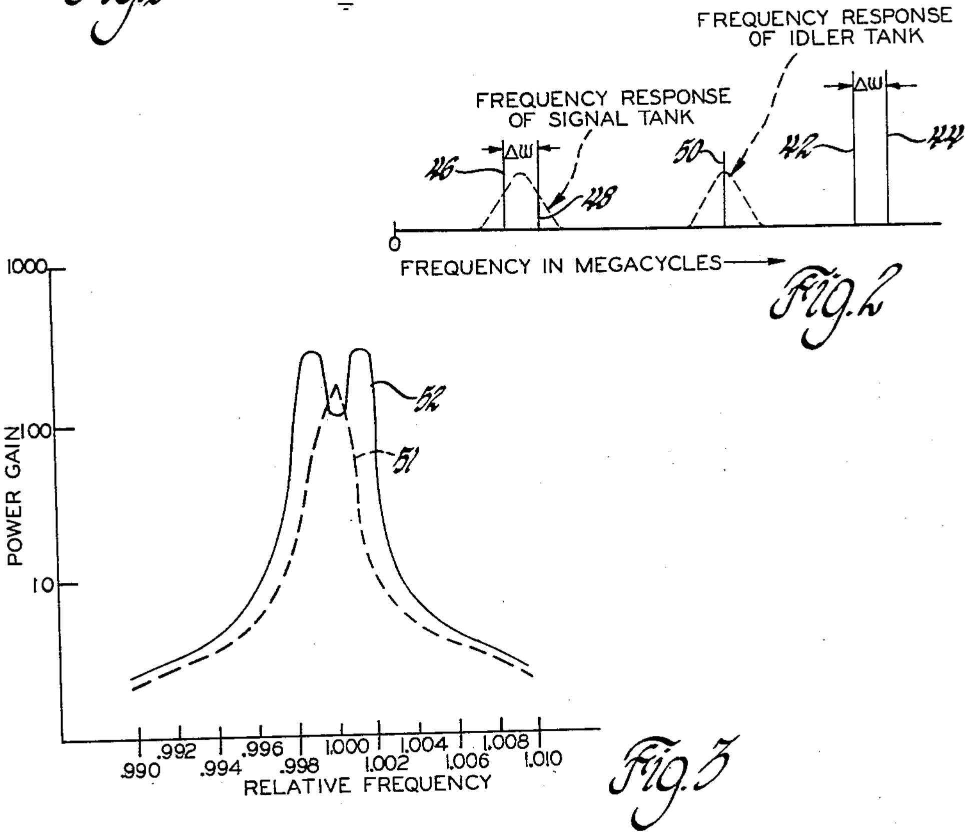
FIGURE 2 is a frequency spectrum chart of the multiple pump source parametric amplifier shown in FIGURE 1.
FIGURE 3 is a plot of power gain versus relative frequency illustrating the comparison between a parametric amplifier using two pump sources and a single pump amplifier.

The explanation just given becomes clearer by reference to FIGURES 2 and 3. In FIGURE 2, the frequency spectrum of the double pump parametric amplifier of FIGURE 1 is shown. The frequencies of the various components are plotted along the horizontal or frequency axis. The pumps 38 and 40 operate at respective frequencies relatively shown at frequency points 42 and 44. The difference between the two pump frequencies 42 and 44 is designated $\Delta\omega$. The two input frequencies $\omega_1$ and $\omega_2$ at which high gain is obtainable are respectively designated as points 46 and 48, also separated by a frequency band $\Delta\omega$. Recalling now the fundamental relationship between the frequencies, that is, the idler frequency is equal to the difference between the pump and signal frequencies, it can be seen that the idler frequency $\Omega_2$, referred to as 50, occurs at a frequency intermediate the pump and signal frequencies. As indicated in FIGURE 2, the common idler frequency 50 falls in the center of the frequency response of the idler tank circuit 14. The signal frequencies 46 and 48 corresponding to $\omega_1$ and $\omega_2$ respectively fall at points centered about the peak of the frequency response of the signal tank circuit 12.

FIGURE 3 is illustrative of the increase in both gain and bandwidth which can be experienced in a parametric amplifier due to multiple pumping. The ratio of input signal frequency to the resonant frequency $\Omega_1$ is plotted on the horizontal axis and power gain is plotted on the vertical axis. The plot 51 illustrates the gain versus frequency of a single pump parametric amplifier. It can be seen that the maximum gain is obtainable at only one input frequency, and that the gain drops off rapidly with deviation from the center frequency. This center frequency is that signal frequency which is required to produce an idler signal having a frequency exactly equal to the resonant frequency of the idler circuit 14. Plot 52 illustrates the increase in bandwidth which can be obtained by double pumping. Plot 52 shows that there are two input signal frequencies at which an idler frequency equal to the resonant frequency of the idler circuit 14 is available. The frequency difference between the two peak gain points corresponds to the frequency difference between the two pumps 38 and 40. This figure is a most impressive indication of the possibility of extending the bandwidth with a number of pumps greater than two.

For purposes of clarification a numerical example will be given of the operation of a double pump negative resistance parametric amplifier having a frequency spectrum corresponding to that shown in FIGURE 2. Assume that the signal tank circuit 12 of the parametric amplifier has a resonant frequency of 20 mc. and the idler tank circuit 14 has a resonant frequency of 30 mc. and that pump 38 operates at 50 mc., while pump 40 is disconnected. In a single pump parametric amplifier the pump frequency required for high gain is the sum of the signal and idler frequencies, in this case 50 mc. If the signal applied to input terminals 30 is exactly 20 mc., the idler frequency will be exactly 30 mc. In this case, the idler frequency falls in the center of the frequency response of the idler tank 14 and no reactive component of the idler or signal tank impedance is present. Therefore, high gain is possible. However, if the signal frequency deviates to 21 mc., then the idler frequency will be 29 mc. This idler frequency does not correspond with the resonant frequency $\Omega_2$ of the idler circuit 14, and thus, a reactive component of the idler circuit 14 admittance will be present at the signal frequency. If the Q of both the signal idler tank is such that a one megacycle deviation from the resonant frequency $\Omega_2$ will produce a reactive component of $j5$ ohms, this reactance would only slightly lower the gain. However, because of the amplification possible due to the added energy of the pump, the idler reactance may be amplified 100 times; that is to $j500$ ohms, while the signal tank reactance is yet $j5$ ohms. The large idler reactance adds to the signal tank reactance and, therefore, makes it impossible to produce any gains at the 21 mc. input signal frequency.

At this point, we will add a second pump 40 with a frequency of 51 mc. In this case, large gain is also possible at an input signal frequency of 21 mc. The resulting idler frequency, which is the difference between the pump frequency of 51 mc. and the input frequency 21 mc., is again 30 mc. This corresponds to the resonant frequency $\Omega_2$ of the idler circuit 14 such that no idler circuit reactance is present. Therefore, there is no idler tank reactance coupled into the signal tank circuit 12, but only the reactance of the signal tank circuit 12 itself. As previously mentioned, the reactance of the signal tank circuit 12 for a one megacycle deviation is on the order of $j5$ ohms, which is negligible. With only pump 38 operating, the signal reactance was $j5+j500=j505$ ohms. Therefore, with both pump 38 and 40 operating, it is possible to obtain a high gain for signal frequencies of both 20 and 21 mc. Thus, the band width has been increased significantly over that of a conventional single pump parametric amplifier.

The multiple pumping concept in parametric amplification yields a further benefit. By means of the multiple pumping the ratio of the dynamic to static capacitance of the variable capacitor 10 is increased over that possible when driven by one pump. The ratio of dynamic to static capacitance is commonly termed the "filling ratio." This filling ratio is of primary importance since the bandwidth obtainable from a parametric amplifier is directly proportional to this factor. The use of two pumps can be shown to increase the filling ratio by approximately 27% over that of a single pump system. The improvement in filling ratio and, thus, bandwidth performance, is an added benefit of the multiple pumped parametric amplifier. However, the main factor which contributes to the increased bandwidth of this device is the fact that a pure real idler tank admittance is present for more than one signal frequency.

Figure 4:
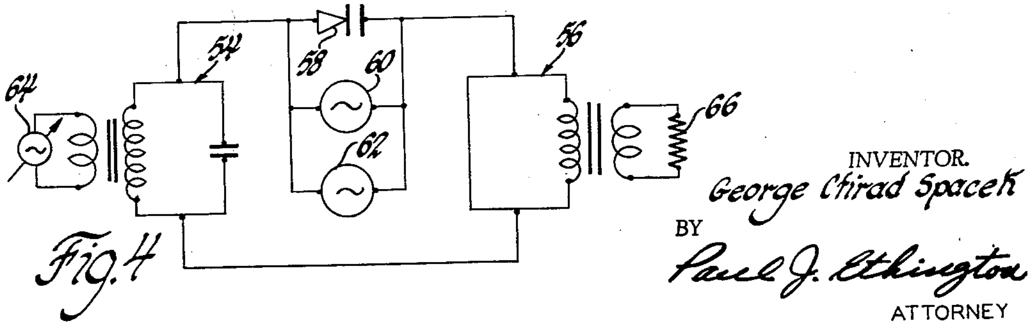
FIGURE 4 is a schematic diagram representative of a positive resistance parametric up-converter.

FIGURE 4 shows the multiple pumping concept as applied to a double pumped parametric up-converter. The term up-converter indicates that the output frequency is greater than the input frequency. The circuit of FIGURE 4 is particularly applicable to radiometric applications wherein the input signal resembles noise. The circuit comprises an input tank circuit 54 and an output tank circuit 56. Each of the tank circuits, 54 and 56, is shown as a parallel resonant circuit comprising an inductor and capacitor. However, these tank circuits are only representative of resonant cavities at microwave frequencies. Connected in series with tank circuits 54 and 56 is a variable capacitance diode 58, which again may be a Varactor. Coupled across the diode 58 there are shown two pumps 60 and 62. Coupled into the input tank circuit 54 is a variable frequency signal source 64. As opposed to the parametric amplifier of FIGURE 1, the up-converter shown in FIGURE 4 employs a load resistor 66 which is coupled into the idler or output tank circuit 56, rather than the input tank circuit 54. Each of the pumps 60 and 62 is operated at a different frequency, $\omega_3$ and $\omega_4$ respectively. In the case of the up-converter, advantage is taken of the fact that the mixing action of the capacitive diode 58 produces a frequency component equal to the sum of pump and signal frequencies as well as a difference component. Thus, the resonant frequency of the idler circuit 56 is chosen to be equal to the sum of the signal and pump frequencies. With this exception, the general operation is comparable with the negative resistance non-degenerate amplifier shown in FIGURE 1. High gain is only obtainable when the voltage across the output tank 56 is a maximum. This condition obtains when the idler frequency component generated in the diode 58, being equal to the sum of the pump frequency and the input signal frequency is equal to the resonant frequency of the output tank 56. The advantage gained by multiple pumping of the up-converter is significantly increasing the bandwidth.

By employing a plurality of pumps 60 and 62, it can be seen that there will exist two signal frequencies at which the signal across the output tank circuit 56 has a frequency corresponding to the resonant frequency of the output tank circuit 56. In the case of the up-converter, the frequencies of the pumps 60 and 62 may be approximately equal to the average of the resonant frequencies of the two tank circuits 54 and 56. The frequency of pump 60 may be slightly below the average frequency while the frequency of pump 62 is slightly above the average frequency. The difference between the frequencies of pumps 60 and 62 is approximately equal to the bandwidth of the output tank 56.

It should be noted that a parametric amplifier may be used either as a straight amplifier in which the output frequency is equal to the input frequency, or as a down-converter in which the output frequency is less than the input frequency, or as an up-converter in which the output frequency is greater than the input frequency.

The parametric amplifier circuits shown in FIGURES 1 and 4 suggest that the input and pump frequencies may be selected such that the idler frequency is equal to the input frequency. In the case of the amplifier shown in FIGURE 1, this would be true where the signal and idler frequencies are exactly equal to one half the pump frequency. In the amplifier of FIGURE 4, the signal and idler frequencies are equal to twice the pump frequency. If the idler and signal frequencies are equal, it is possible to dispense with the idler tank circuit 14 shown in FIGURE 1 and rely on the frequency response of the signal tank circuit 12. This is known as degenerate parametric amplification.

Applying the multiple pumping concept to degenerate parametric amplification, reference may again be taken to FIGURE 1. The requirement that the idler signal, which in this case is equal in frequency to the input signal, correspond exactly with the resonant frequency $\Omega_1$ of the signal tank circuit 12 is still paramount. If only a single pump were employed, and the input signal frequency should deviate from the resonant frequency of the signal tank circuit 12, the amplification due to the pumping source power would multiply the reactive component of signal tank admittance, such that no significant gain would be obtainable. By providing two pumps, such as 38 and 40, wherein the frequency difference is, for example, equal to one megacycle, then there exist two signal frequencies at which the difference between the signal and the pump frequencies is equal to the resonant frequency $\Omega_1$ of the signal tank circuit 12.

The invention has been specifically applied to improving the gain-bandwidth performance of the parametric amplifier. This is accomplished by separating the two or more input frequencies at which high gain is obtainable by only a narrow frequency band as indicated in FIGURES 2 and 3. However, it is contemplated that the system described herein may be adapted for use as a frequency discriminating filter merely by selecting pump frequencies which allow amplification only at discrete input frequencies. The frequencies may be separated by bands greater than that indicated in FIGURES 2 and 3.

It is to be understood that the invention has been explained with reference to particular embodiments thereof, and that various modifications may be made to this system without departing from the spirit and scope of the invention. For a definition of the invention, reference should be made to the appended claims.

What is claimed is:

1. A parametric amplifier comprising resonant means, the resonant means being resonant to an idler frequency, non-linear reactance means connected in energy transfer relation with the resonant means, input circuit means for coupling into the non-linear reactance means an input signal having a frequency within a predetermined frequency range, first and second pump means coupled to the non-linear reactance means for pumping the same at first and second frequencies which are respectively equal to the sum of the idler frequency and first and second signal frequencies within said predetermined range, and means to couple an output signal out of the resonant means.

2. A parametric amplifier comprising a pair of resonant tanks; one of the tanks being resonant to a signal frequency and the other tank being resonant to an idler frequency, non-linear reactance means connected energy transfer relation between the resonant tanks, input circuit means for coupling into said one tank an input signal having a frequency within a predetermined range about said signal frequency, first and second pump means coupled to the non-linear reactance means for pumping the same at first and second frequencies which are respectively equal to the sum of the idler frequency and first and second signal frequencies within said predetermined range, and output circuit means to couple an output signal out of one of the resonant tanks.

3. A parametric amplifier as defined by claim 2 wherein the output circuit means is coupled to the idler tank to couple energy out of the idler tank.

4. A parametric amplifier as defined by claim 2 wherein the output circuit means is coupled to the signal tank to couple energy out of the signal tank.

References Cited in the file of this patent

FOREIGN PATENTS 1,112,139 Germany ............... Aug. 3, 1961